(12) United States Patent
Mushini et al.

(10) Patent No.: US 10,529,753 B2
(45) Date of Patent: Jan. 7, 2020

(54) PIXELS

(71) Applicant: Sensors Unlimited, Inc., Princeton, NJ (US)

(72) Inventors: Prabhu Mushini, Annandale, NJ (US); Wei Huang, Plainsboro, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 14/931,569

(22) Filed: Nov. 3, 2015

(65) Prior Publication Data
US 2017/0125465 A1   May 4, 2017

(51) Int. Cl.
| H01L 27/146  | (2006.01) |
| H01L 31/0216 | (2014.01) |
| H01L 31/0352 | (2006.01) |
| H01L 31/103  | (2006.01) |
| H01L 31/0224 | (2006.01) |

(52) U.S. Cl.
CPC .. *H01L 27/14605* (2013.01); *H01L 27/14649* (2013.01); *H01L 31/02161* (2013.01); *H01L 31/022416* (2013.01); *H01L 31/03529* (2013.01); *H01L 31/1035* (2013.01)

(58) Field of Classification Search
CPC ......... H01L 27/14605; H01L 27/14649; H01L 31/02161; H01L 31/102
USPC ....... 257/443, 187, 438, 463, E21.03; 356/9; 250/370.14; 438/59
See application file for complete search history.

(56) References Cited

U.S. PATENT DOCUMENTS

| 4,682,196 A | * | 7/1987 | Sakai ............... H01L 31/035281 257/458 |
| 4,878,120 A | | 10/1989 | Matsumoto et al. |
| 5,536,455 A | * | 7/1996 | Aoyama ................. B29C 41/20 264/1.7 |
| 6,015,721 A | * | 1/2000 | Kim .................. H01L 31/03529 257/E31.039 |
| 6,555,890 B2 | * | 4/2003 | Dries ................. H01L 31/02024 257/436 |
| 6,573,581 B1 | * | 6/2003 | Sugg ................. H01L 31/03042 257/451 |
| 6,803,557 B1 | * | 10/2004 | Taylor ............... H01L 27/14618 250/208.1 |
| 8,586,937 B2 | | 11/2013 | Bouhnik et al. |
| 8,687,174 B2 | | 4/2014 | Fossum et al. |
| 8,835,999 B2 | | 9/2014 | Janesick |
| 2004/0119093 A1 | * | 6/2004 | Cohen ................. H01L 31/0232 257/200 |
| 2007/0012948 A1 | * | 1/2007 | Dries ................ H01L 27/14643 257/186 |

(Continued)

*Primary Examiner* — Dzung Tran
(74) *Attorney, Agent, or Firm* — Locke Lord LLP; Scott D. Wofsy; Alicia J. Carroll

(57) ABSTRACT

A photodiode has an absorption layer and a cap layer operatively connected to the absorption layer. A pixel is formed in the cap layer and extends into the absorption layer to receive charge generated from photons therefrom. The pixel defines an annular diffused area to reduce dark current and capacitance. A photodetector includes the photodiode. The photodiode includes an array of pixels formed in the cap layer. At least one of the pixels extends into the absorption layer to receive charge generated from photons therefrom. At least one of the pixels defines an annular diffused area to reduce dark current and capacitance.

6 Claims, 1 Drawing Sheet

(56) References Cited

U.S. PATENT DOCUMENTS

| | | | | |
|---|---|---|---|---|
| 2007/0215900 A1* | 9/2007 | Maimon | ............ | B82Y 20/00 |
| | | | | 257/184 |
| 2011/0031401 A1* | 2/2011 | Mitra | ............ | H01L 31/02966 |
| | | | | 250/338.4 |
| 2012/0273838 A1* | 11/2012 | Kinch | ............ | H01L 31/02966 |
| | | | | 257/188 |
| 2012/0326122 A1* | 12/2012 | Fujii | ............ | C30B 25/183 |
| | | | | 257/14 |
| 2015/0333202 A1* | 11/2015 | Ahn | ............ | H01L 31/105 |
| | | | | 257/184 |

* cited by examiner

PIXELS

BACKGROUND OF THE INVENTION

1. Field of the Invention

The present disclosure relates to photodiode arrays (PDAs), and more particularly to a unit pixel construction for photodiode arrays.

2. Description of Related Art

Traditional pixels made up of diodes (PN, PiN, Avalanche diodes, etc.), such as those used in photodiode arrays, contribute to the dark current and capacitance of the overall PDA. Pixel dark current and capacitance are key factors in determining the pixel performance. Lower values tend to indicate better pixel performance which ultimately translates to better signal to noise ratios at the overall camera and system levels. Pixel dark current and capacitance are significant contributors to the overall camera level noise. The unit pixel design plays a significant role in defining these contributing parameters to system level noise.

Such conventional pixel designs have generally been considered satisfactory for their intended purpose. However, there is still a need in the art for improved designs.

SUMMARY OF THE DISCLOSURE

A photodiode has an absorption layer and a cap layer operatively connected to the absorption layer. A pixel is formed in the cap layer and extends into the absorption layer to receive charge generated from photons therefrom. The pixel has an annular diffused area to reduce dark current and capacitance.

In accordance with some embodiments, the pixel includes a p-type material. The pixel can be generated through diffusion, implantation, epitaxial growth or the like. The absorption layer can be a semiconductor material able to detect optical signals from a light source through wavelengths ranging from the ultraviolet region to the long-wave infrared region. The cap layer can be a nominally doped semiconductor layer. The cap layer can be matched to the absorption layer and can have a wider bandgap material lattice than the absorption layer to provide passivation of the absorption layer.

The annular diffused area can define an inner diameter and an outer diameter. A portion of the cap layer can be within the inner diameter of the annular diffused area and a portion of the cap layer can be outside of the outer diameter of the annular diffused area. The absorption layer can be an indium gallium arsenide (InGaAs) absorption layer. The cap layer can be an indium phosphate (InP) cap layer. The photodiode can include a dielectric material layer overlaid on the cap layer opposite from the absorption layer. The dielectric material layer can cover the portion of the cap layer within the inner diameter of the annular diffused area.

In another aspect, a photodetector includes the photodiode as described above. The photodiode includes an absorption layer and a cap layer and operatively connected to the absorption layer. An array of pixels is formed in the cap layer. At least one of the pixels extends into the absorption layer to receive charge generated from photons therefrom. At least one of the pixels has an annular diffused area to reduce dark current and capacitance. In accordance with some embodiments, the photodetector includes a read-out integrated circuit (ROIC) operatively connected to the photodiode. The photodiode can include the dielectric material layer, described above, overlaid on the cap layer opposite from the absorption layer, between the cap layer and the ROIC.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
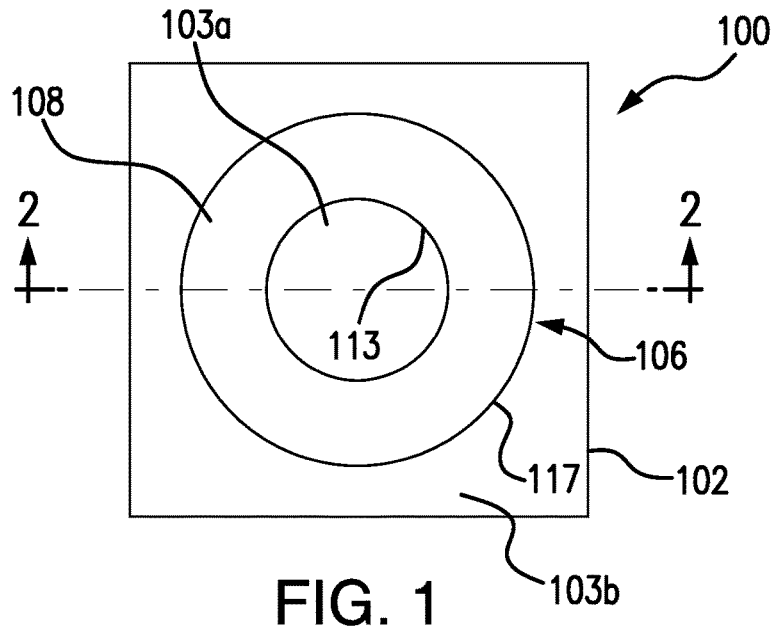
FIG. 1 is a schematic depiction of a top view of an exemplary embodiment of a portion of a photodiode constructed in accordance with the present disclosure, showing the pixel formed in the cap layer having an annular diffused area.

Reference will now be made to the drawings wherein like reference numerals identify similar structural features or aspects of the subject disclosure. For purposes of explanation and illustration, and not limitation, a top view of an exemplary embodiment of a photodiode in accordance with the disclosure is shown in FIG. 1 and is designated generally by reference character 100. Other embodiments of photodiodes in accordance with the disclosure, or aspects thereof, are provided in FIG. 2, as will be described. The photodiodes described have reduced dark current and capacitance as compared with traditional photodiodes, resulting in lower noise characteristics.

As shown in FIG. 1, a photodiode 100 has a cap layer 102. A pixel 106 is formed in cap layer 102 through one of diffusion, implantation, epitaxial growth, or the like. Pixel 106 has an annular diffused area 108 to reduce dark current and capacitance as compared to traditional pixels. It is contemplated that pixel 106 can be made from an acceptor material, e.g. zinc, or the like. Annular diffused area 108 defines an inner diameter 113 and an outer diameter 117. A portion 103a of cap layer 102 is within inner diameter 113 of annular diffused area 108 and a portion 103b of cap layer 102 is outside of outer diameter 117 of annular diffused area 108.

Figure 2:
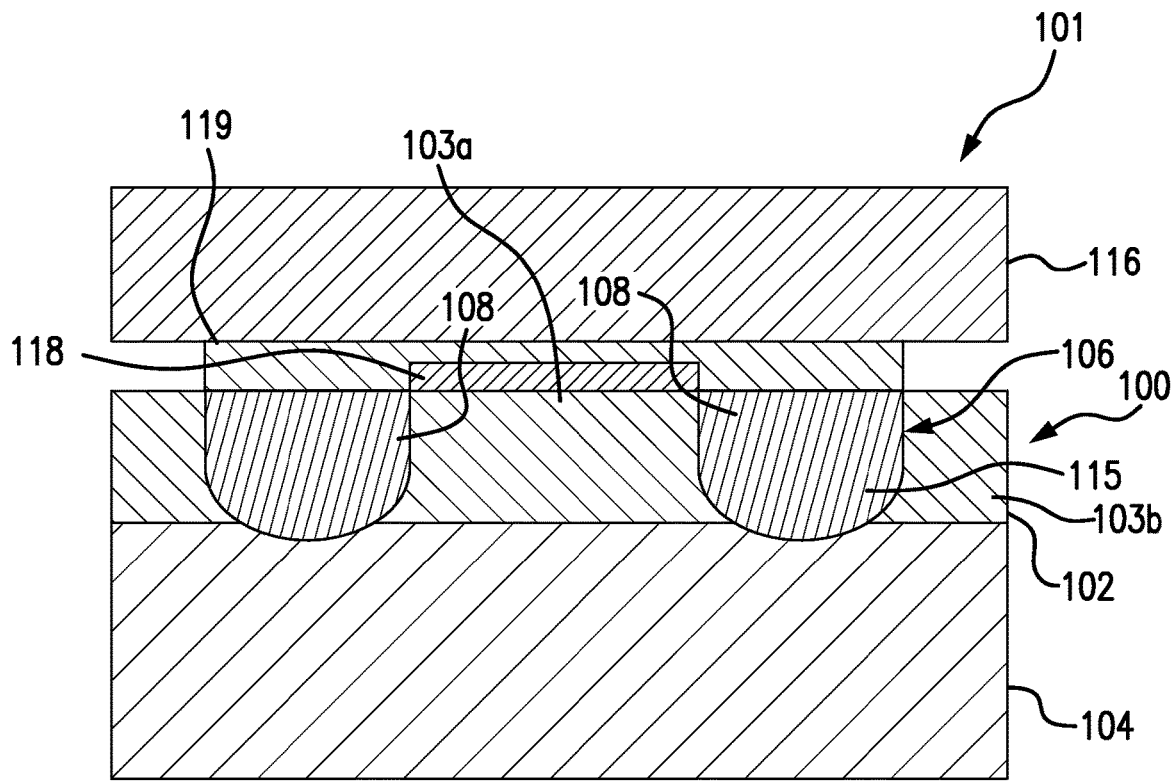
FIG. 2 is schematic depiction of a cross-sectional view of a photodetector constructed in accordance with the present disclosure, showing the ROIC operatively connected to the photodiode to form the photodetector.

With reference now to FIG. 2, a photodetector 101 includes photodiode 100. Photodetector 101 includes a ROIC 116 operatively connected to a top metal layer 119 of photodiode 100 through bump bonding. Photodiode 100 includes an absorption layer 104 operatively connected to cap layer 102. Absorption layer 104 has specific absorption characteristics that allow it to absorb photons and generate electron hole pairs in that layer. Those skilled in the art will readily appreciate that absorption layer 104 is typically epitaxially grown on a highly doped substrate (not shown). It is contemplated that absorption layer 104 can be lattice matched to the substrate and in cases is also strained with stress with respect to the substrate.

With continued reference to FIG. 2, cap layer 102, a semiconductor layer usually of the same or larger bandgap material as absorption layer, is epitaxially grown on top of absorption layer 104. Cap layer 102 resists and/or prevents the exposure of absorption layer 104 to the natural elements and from oxidation or change to its semiconductor characteristics. It is contemplated that absorption layer 104 can be a semiconductor material able to detect optical signals from a light source through wavelengths ranging from the ultraviolet region to the long-wave infrared region, e.g. from 0.1-10 microns. Those skilled in the art will readily appreciate that cap layer 102 can be a nominally doped semiconductor layer. Cap layer 102 is matched to absorption layer 104 and has a wider bandgap material lattice than absorption layer 104 to provide passivation of absorption layer 104.

As shown in FIGS. 1 and 2, photodiode 100 includes a dielectric material layer 118 overlaid on cap layer 102 opposite from absorption layer 104. Dielectric material layer 118 covers portion 103a of cap layer 102 within inner diameter 113 of annular diffused area 108. Dielectric material layer 118 provides isolation for metal layer 119 from directly making contact with the undoped region of the semiconductor (e.g. portions 103a and 103b of cap layer 102). Metal layer 119 on top of pixel 106 only contacts the doped regions, e.g. annular diffused area 108, of pixel 106 to provide optimal ohmic contact and the subsequent diode characteristics such reverse leakage and capacitance. Those skilled in the art will readily appreciate that absorption layer 104 can have metal or semiconductor layers on top, bottom or both, e.g. cap layer 102, to form collection regions where the generated electron hole pairs are collected under bias to generate charge which is then collected by ROIC 116. Those skilled in the art will readily appreciate that absorption layer 104 can be an InGaAs absorption layer 104, or any other suitable semiconductor which can detect optical signals. It is also contemplated that cap layer 102 can be an InP cap layer 102, or the like.

Typically, collection regions in a photodiode that form the pixels (they can be anode or cathode) are fabricated by diffusing, implanting or epitaxially growing dopants to form P+0 or N+ regions on either side of an absorption layer through a cap layer. These P+ or N+ regions determine area and size of a pixel. In embodiments of the present disclosure, pixel 106 is formed by diffusing an acceptor or dopant species into the absorption layer through cap layer 102. Pixel 106 extends through cap layer 102 into absorption layer 104 to receive photons therefrom. Pixel 106 has an annular cylindrically shaped diffusion area 115 that extends into cap layer 102. Pixel 106 is defined by the area between the annular rings that includes the dopant species, e.g. between inner diameter 113 and outer diameter 117. The area of pixel 106 thus defined has lower area and volume of dopant species that traditional pixels, which leads to a smaller depletion region than a traditional pixel generally defined by a fully enclosed circular area. The lower depletion region created by the annular pixel design of pixel 106 yields lower dark current and capacitance both of which are also dependent on the pixel area.

The annular shape of pixel 106 reduces diffused area 108 as compared with traditional pixels thereby reducing the overall diffused, implanted or epitaxially grown charge to form the junction diode, thereby reducing the depletion region of the diode without reducing the absorption capability of pixel 106. This leads to lower dark current and capacitance, reducing noise and improving the signal to noise ratio in the camera in which photodiode 100 is being used.

The methods and systems of the present disclosure, as described above and shown in the drawings, provide for discharge systems having superior properties including the ability to reduce dark current and capacitance, without reducing absorption capabilities of the pixel. While the apparatus and methods of the subject disclosure have been shown and described with reference to embodiments, those skilled in the art will readily appreciate that changes and/or modifications may be made thereto without departing from the spirit and scope of the subject disclosure.

What is claimed is:

1. A photodetector comprising: a photodiode, wherein the photodiode includes: an absorption layer; a cap layer operatively connected to the absorption layer; and an array of pixels formed in the cap layer, wherein at least one of the pixels extends into the absorption layer to receive charge generated from photons therefrom, wherein at least one of the pixels has an annular diffused area, with an undoped portion of the cap layer within the inner diameter of the annular diffused area; and a metal layer operatively connected to the annular diffused area of at least one of the pixels; and a read-out integrated circuit (ROIC) operatively connected to the photodiode, wherein the photodiode includes a dielectric material layer directly overlaid on the undoped portion of the cap layer opposite from the absorption layer, between the cap layer and the ROIC, wherein the dielectric material layer covers the undoped portion of the cap layer within the inner diameter of the annular diffused area, wherein the dielectric material layer covers the undoped portion of the cap layer within the inner diameter of the annular diffused area, wherein the dielectric material layer is positioned between the undoped portion of the cap layer within the inner diameter of the diffused area and the metal layer, and wherein the metal layer is positioned between the ROIC and the annular diffused area of at least one of the pixels.

2. The photodetector as recited in claim 1, wherein at least one of the pixels includes a p-type material.

3. The photodetector as recited in claim 1, wherein the pixels are generated through at least one of diffusion, implantation or epitaxial growth.

4. The photodetector as recited in claim 1, wherein the absorption layer is a semiconductor material able to detect optical signals from a light source through wavelenghths ranging from ultraviolet region to long-wave infrared region.

5. The photodetector as recited in claim 1, wherein the cap layer is a nominally doped semiconductor layer, wherein the cap layer is matched to the absorption layer, and wherein the cap layer has a wider bandgap material lattice than the absorption layer to provide passivation of the absorption layer.

6. The photodetector as recited in claim 1, wherein the annular diffused area defines an inner diameter and an outer diameter, wherein a portion of the cap layer is within the inner diameter of the annular diffused area and a portion of the cap layer is outside of the outer diameter of the annular diffused area.

* * * * *